United States Patent
Ohannes

(10) Patent No.: US 6,657,509 B1
(45) Date of Patent: Dec. 2, 2003

(54) DIFFERENTIALLY CONTROLLED VARACTOR

(75) Inventor: James R. Ohannes, Cape Elizabeth, ME (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 10/151,652

(22) Filed: May 20, 2002

Related U.S. Application Data

(63) Continuation of application No. 09/769,920, filed on Jan. 25, 2001, now abandoned.

(51) Int. Cl.[7] ................................................ H03B 1/00

(52) U.S. Cl. ............................ 331/177 V; 331/36 C; 331/117 R; 331/117 FE; 331/167

(58) Field of Search .......................... 331/36 C, 117 R, 331/117 V, 167; 327/586, 325

(56) References Cited

U.S. PATENT DOCUMENTS 6,292,065 B1 * 9/2001 Friedman et al. ........ 331/117 R

OTHER PUBLICATIONS

Hong–Ih Cong, et al., "A 10–Gb/s 16:1 Multiplexer and 10–GHz Clock Synthesizer in 0.25–μm SiGe BiCMOS", *IEEE Journal of Solid–State Circuits*, vol. 36, No. 12, Dec. 12, 2001, pp. 1946–1953.

* cited by examiner

*Primary Examiner*—Arnold Kinkead
(74) *Attorney, Agent, or Firm*—Merchant & Gould PC; Joshua W. Korver

(57) ABSTRACT

A differentially controlled variable capacitor includes two variable capacitors that are arranged effectively in parallel and receive differential input. The variable capacitors are coupled to a common node that is biased to a potential. For diode-type variable capacitors, the bias potential should ensure that the variable capacitors continue to operate as capacitors by preventing the diode device from becoming forward-biased. The differentially controlled variable capacitors are useful as tuning elements in circuits that require frequency control. A noise signal may be injected into the control signal of the variable capacitors. The effective parallel arrangement of the variable capacitors allows differential control of the effective capacitance value such that the noise signal does not alter the effective capacitance value. The differentially controlled variable capacitor is useful in circuits such as oscillators, tuned filters, and other electronic circuits that require a tuned frequency or tuned capacitance.

13 Claims, 7 Drawing Sheets

DIFFERENTIALLY CONTROLLED VARACTOR

RELATED APPLICATIONS

This is a continuation of U.S. patent application Ser. No. 09/769,920, now abandoned, entitled "Differentially Controlled Varactor," filed Jan. 25, 2001, under 35 U.S.C. §120 and 37 C.F.R. §1.53(b), which is incorporated herein by reference.

FIELD OF THE INVENTION

The present invention relates to a method and apparatus for an oscillator. In particular, the present invention relates to an oscillator that includes a variable capacitor and is insensitive to common-mode noise.

BACKGROUND OF THE INVENTION

A variable capacitor is useful in tuned electronic circuits. A control signal determines the amount of capacitance that is provided by the variable capacitor. The variable capacitor can be used to make an electronic circuit electrically tunable over a range of frequency. One type of variable capacitor device is a varactor.

A varactor is a nonlinear device that provides a capacitance that varies responsive to an applied control voltage. A diode-type of device is often used as a varactor (hereinafter referred to as a varactor diode). Varactor diodes are operated in a reverse-bias operating mode. When the diode is reverse-biased, the capacitance of the pn junction decreases with an increasing reverse voltage. Although any diode can be used as a varactor, diodes are often specifically designed for this variable capacitance characteristic. A transistor can also be operated as a varactor. By reverse biasing a junction of a transistor, the capacitance of the junction decreases as with the increasing reverse voltage.

Varactors are used in analog circuits that require frequency tuning. Oscillators often use varactors to electrically tune the frequency of oscillation. Electrically tunable oscillators are useful in electronic systems such as frequency modulators and phase-locked loops. LC-type oscillators use an inductor and a capacitor to determine the frequency of oscillation. LC oscillators may be active or passive. Active LC oscillators provide for gain at the oscillator's resonant frequency. LC oscillators may be arranged in a variety of configurations in order to produce an oscillating signal.

SUMMARY OF THE INVENTION

Briefly stated, a differentially controlled variable capacitor includes two variable capacitors that are arranged effectively in parallel and receive differential input. Each variable capacitor can be any device that operates as a variable capacitance, such as a Bipolar device, a MOS device, a MOS capacitor, a reverse-biased diode, or a varactor. The variable capacitors are coupled to a common node that is biased to a potential. For diode-type variable capacitors, the bias potential should ensure that the variable capacitors continue to operate as capacitors by preventing the diode device from becoming forward-biased. The differentially controlled variable capacitors are useful as tuning elements in circuits that require frequency control. A noise signal may be injected into the control signal of the variable capacitors. The effective parallel arrangement of the variable capacitors allows differential control of the effective capacitance value such that the noise signal does not alter the effective capacitance value. The differentially controlled variable capacitor is useful in circuits such as oscillators, tuned filters, and other electronic circuits that require a tuned frequency or tuned capacitance.

In accordance with one aspect of the present invention, an electronic circuit with at least one differentially controlled variable capacitance, comprises a differentially controlled variable capacitance that has a differential input and is coupled to a common node that is biased to a potential. Also a differential control signal is coupled to the differential input such that the differential control signal changes a capacitance value associated with the differentially controlled variable capacitance.

In accordance with another aspect of the present invention, a method for tuning an oscillation frequency in an oscillator, comprises coupling a first variable capacitor to a common node in the oscillator, the first variable capacitor having a first associated value that is responsive to a first control signal. Also, coupling a second variable capacitor to the common node in the oscillator, the second variable capacitor having a second associated value that is responsive to a second control signal. Then adjusting at least one of the first and second control signals such that the first and second variable capacitors provide for tuning of the oscillation frequency that minimizes variations in the oscillation frequency due to common mode noise on the first and second control lines.

In accordance with yet another aspect of the present invention, an apparatus for minimizing noise effects in an oscillator with a variable oscillation frequency, comprises: a first variable capacitance means is coupled to a common node in the oscillator; a second variable capacitance means is coupled to the common node in the oscillator; a first means for controlling the first variable capacitance means; a second means for controlling the second variable capacitance means; and means for varying the oscillation frequency with the first means for controlling and the second means for controlling such that the variable oscillation frequency is changed by the first and second variable capacitance means, whereby variations in the variable oscillation frequency from noise effects are minimized by the arrangement of the first and second variable capacitance means.

DETAILED DESCRIPTION OF THE PREFERRED EMBODIMENT

In the following detailed description of exemplary embodiments of the invention, reference is made to the accompanied drawings, which form a part hereof, and which is shown by way of illustration, specific exemplary embodiments of which the invention may be practiced. These embodiments are described in sufficient detail to enable those skilled in the art to practice the invention, and it is to be understood that other embodiments may be utilized, and other changes may be made, without departing from the spirit or scope of the present invention. The following detailed description is, therefore, not to be taken in a limiting sense, and the scope of the present invention is defined only by the appended claims.

The present invention relates to differentially controlled variable capacitors. Differentially controlled variable capacitors can be included in oscillator designs for modulators, phase-locked loops, filters, and other configurations.

Voltage controlled oscillators can be designed with a control line coupled to a variable capacitor for adjusting the oscillator frequency. A control signal that is coupled to the variable capacitor may originate from a node in the circuit that contains a noise signal. A noise signal originating from the node can have many adverse effects. With a single-ended control signal, noise can be injected into the oscillator signal through parasitic capacitors. In addition, the noise signal may have an adverse effect on the oscillator frequency by modulating the variable capacitor as well as causing other noise related problems (i.e. degrading the oscillator ability to provide a stable oscillation). As will become apparent in the following disclosure, the noise effect can be minimized by controlling the variable capacitor through a differential control signal.

Figure 1:
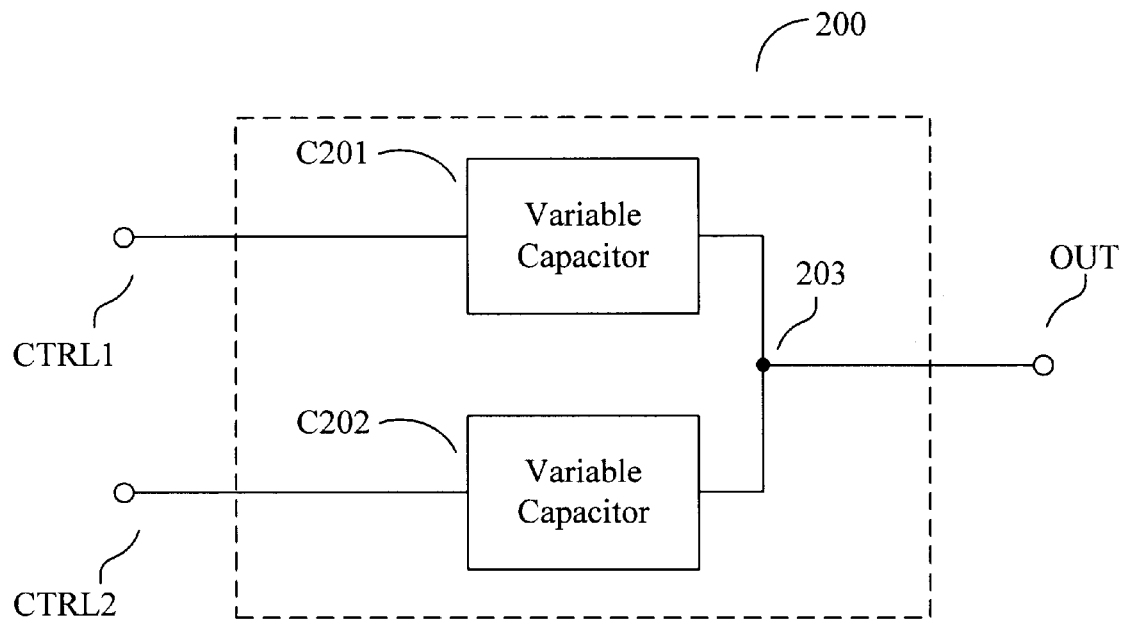
FIG. 1 illustrates a schematic diagram of a differentially controlled variable capacitor.

FIG. 1 illustrates a schematic diagram of a differentially controlled variable capacitor. The differentially controlled variable capacitor (200) includes differential input ports (CTRL1, CTRL2) and an output port (CAP). The impedance of the differentially controlled variable capacitor (200) is measured between the differential input ports (CTRL1, CTRL2) and the output port (CAP). The differentially controlled variable capacitor (200) is a nonlinear device. Since the differentially controlled variable capacitor (200) is nonlinear, the impedance value will vary according to the value of the differential input applied. The controlled capacitance is useful for providing a tuning element to circuits such as oscillators, filters and phase-locked loops.

Figure 2:
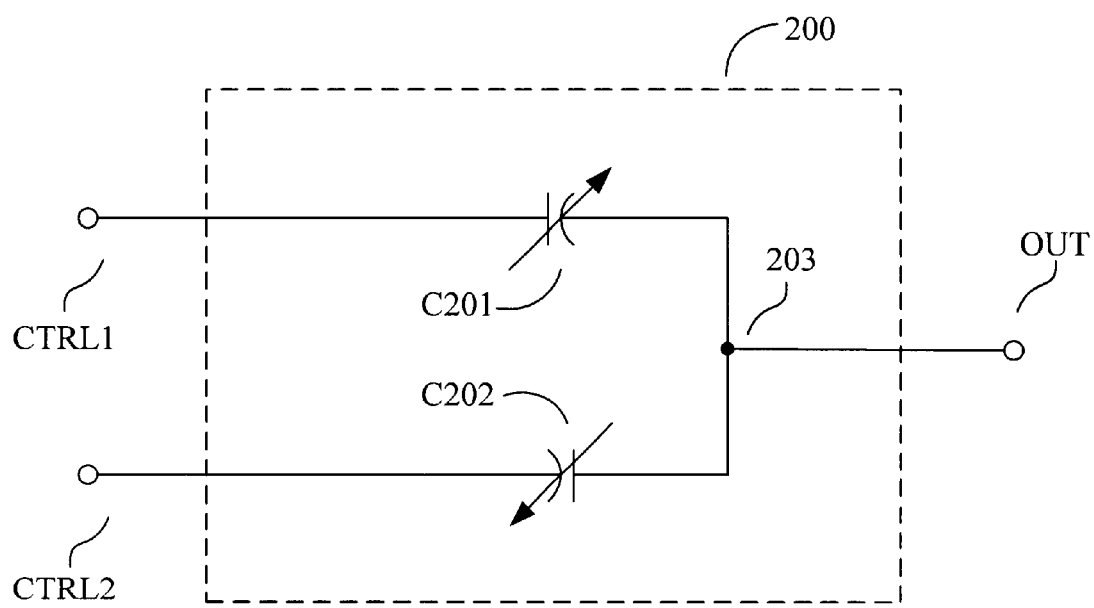
FIG. 2 shows a schematic diagram illustrating components of a differentially controlled variable capacitor.

FIG. 2 illustrates a functional representation of the differentially controlled variable capacitor (200) from FIG. 1. The differentially controlled variable capacitor (200) includes two variable capacitors (C201, C202) that are effectively arranged in parallel between the input ports (CTRL1, CTRL2) and a common node (203). One of the variable capacitors (C201) is coupled in series between an input port (CTRL1) and the common node (203). The other variable capacitor (C202) is coupled in series between the other input port (CTRL2) and the common node (203).

Each variable capacitor (C201, C202) can be physically designed as other electronic devices. An example device that can function as a variable capacitor is a reverse-biased diode. Specialized reverse-biased diodes that are constructed as voltage-variable capacitors are known as varactor diodes. A varactor diode is reverse-biased when a negative voltage is present across the varactor diode junction. Other devices that can function as variable capacitors include, but are not limited to, MOS devices, BiCMOS devices, Bipolar devices, and GaAs devices, as well as others.

If a diode or a similar device is used as the variable capacitors (C201, C202) in the differentially controlled variable capacitor (200), then it is important to avoid forward-biasing the devices. In the differentially controlled variable capacitor (200), the variable capacitors (C201, C202) are reversed-biased depending upon the potentials of the input nodes (CTRL1, CTRL2) and the potential of the common node (203). Variable capacitors C201 and C202 are arranged to have opposite polarities. For the case when diodes are utilized, the potential of one of the input ports (e.g., CTRL1) has a potential that is higher than the potential of the common node (203), while the potential of the other input port (e.g., CTRL2) is lower than the potential of the common node (203). This ensures that the diodes are reversed-biased to operate as the variable capacitors (C201, C202).

The potential at the common mode (203) is equal to the potential of the output port (CAP). The capacitance value of variable capacitor C201 is related to the difference in potential of output port CAP and the potential of input port CTRL1 (e.g., $V_{CAP}-V_{CTRL1}$). Similarly, the capacitance value of variable capacitor C202 is related to the difference in potential of input port CTRL2 and the potential of output port CAP (e.g., $V_{CTRL2}-V_{CAP}$). $V_{CTRL1}$ and $V_{CTRL2}$ are D.C. voltages. Ideally, each control line has a control signal that serves as an A.C. ground in the circuit. Thus, the effective total capacitance appearing between A.C. ground and node 203 is determined by the capacitive values of both variable capacitors C201 and C202 combined in parallel.

Figure 3A:
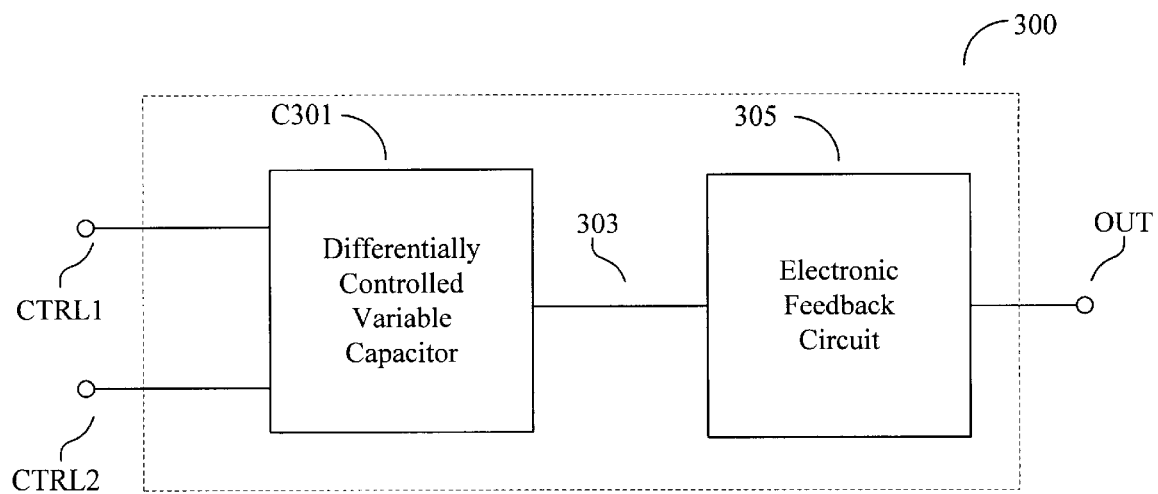
FIG. 3A illustrates a schematic diagram of a differentially controlled variable capacitor used in an oscillator.

FIG. 3A illustrates a schematic diagram of an example of a differentially controlled variable capacitor used in an oscillator. The oscillator includes differential input ports (CTRL1, CTRL2), a differentially controlled variable capacitor (C301), an electronic feedback circuit (305), and an output port (OUT). The differential input ports (CTRL1, CTRL2) are coupled to the differentially controlled variable capacitor (C301). The capacitance of the differentially controlled variable capacitor (C301) varies with a change in the potential at the input ports (CTRL1, CTRL2).

An output line (303) of the differentially controlled variable capacitor (C301) is coupled to an electronic feedback circuit (305). The electronic feedback circuit (305) has an output for providing an oscillating signal to subsequent circuitry. Although the output is shown as single-ended, the output may also be arranged as a differential output.

Figure 3B:
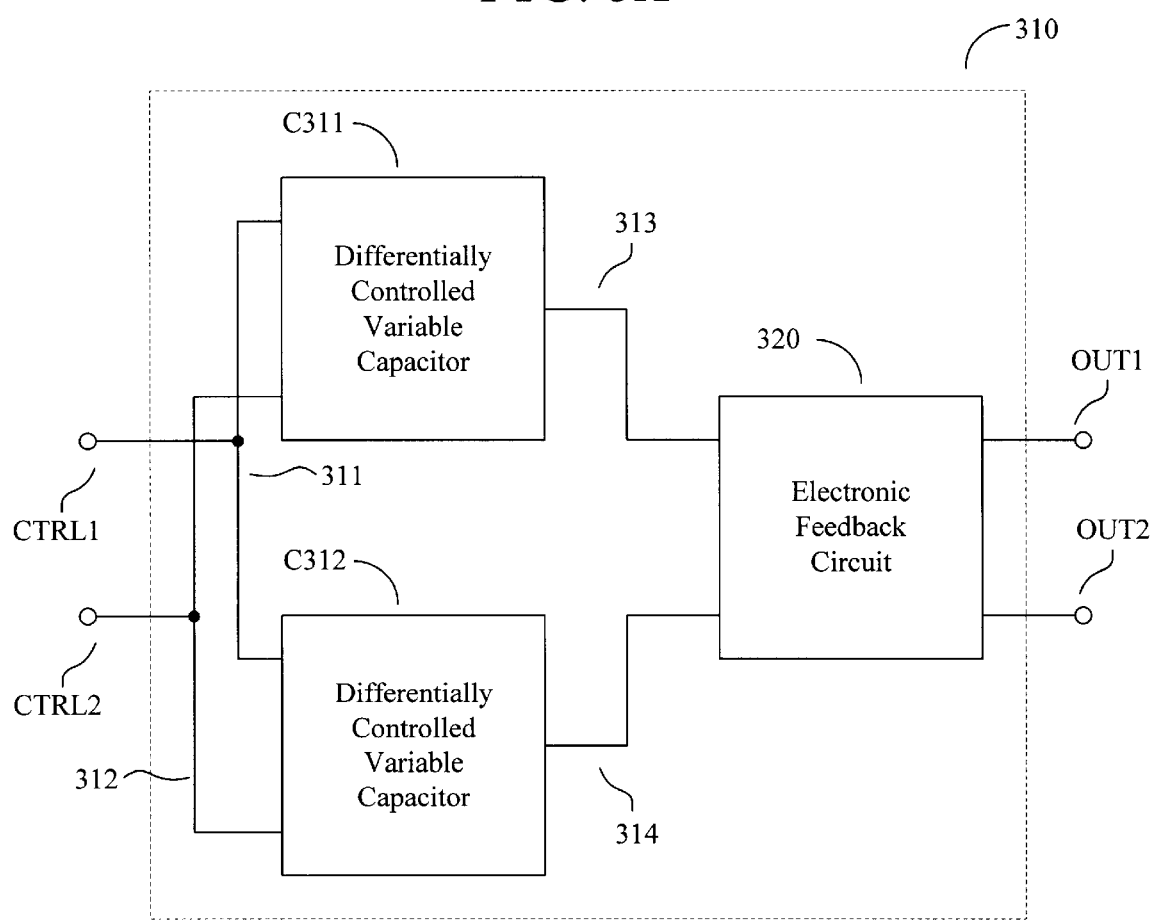
FIG. 3B illustrates a schematic diagram of another oscillator using more than one differentially controlled variable capacitor.

FIG. 3B illustrates a schematic diagram of an example of an oscillator using more than one differentially controlled variable capacitor. The oscillator includes differential input ports (CTRL1, CTRL2), differentially controlled variable capacitors (C311, C312), an electronic feedback circuit (320), and differential output ports (OUT1, OUT2).

The differential input ports (CTRL1, CTRL2) are coupled through a pair of nodes (311, 312) to the differentially controlled variable capacitors (C311, C312). The effective total capacitance of each differentially controlled variable capacitor (C311, C312) varies with a change in the potential at the input ports (CTRL1, CTRL2).

The output lines (313, 314) of the differentially controlled variable capacitors (C311, C312) are coupled to an electronic feedback circuit 320. The electronic feedback circuit (320) provides positive feedback for generating an oscillating signal. In one embodiment of the invention, the electronic feedback circuit (320) may contain a negative resistance circuit. The electronic feedback circuit (320) has a differential output (OUT1, OUT2) for providing an oscillating signal to subsequent circuitry. The differential output (OUT1, OUT2) may be A.C. coupled or D.C. coupled as is desired. Although the output is shown as differential, the output may also be arranged as single-ended.

A noise signal may occur at the input ports (CTRL1, CTRL2). The arrangement of differentially controlled variable capacitors (C311, C312) minimizes the adverse effects of the noise signal. The minimization of the effects on the oscillator will become apparent from the discussion which follows below.

As an example, a 100 mV noise signal is introduced at both input ports (CTRL1, CTRL2). The effective total capacitance for the differentially controlled variable capacitors (C311, C312) is not affected by the noise signal. Each variable capacitor (C311, C312) is described according to FIG. 2. The variable capacitors (C201, C202) within each differentially controlled variable capacitor (C311, C312) have opposite polarities. The 100 mV noise signal will affect the capacitance values of variable capacitors C201 and C202 in opposite directions. When the capacitance values of variable capacitors C201 and C202 are equal (C201=C202=C), the effective total capacitance will be twice that value (C201||C202=2C). With the noise signal, the capacitance values of variable capacitors C201 and C202 will change by a value corresponding to the noise signal level, in opposite directions (C201+Δ, C202−Δ). When the two values of capacitance for the variable capacitors C201 and C202 are combined in parallel, there is no net change in effective total capacitance, as noise signal is offset (C201+Δ||C202−Δ=2C).

Figure 3C:
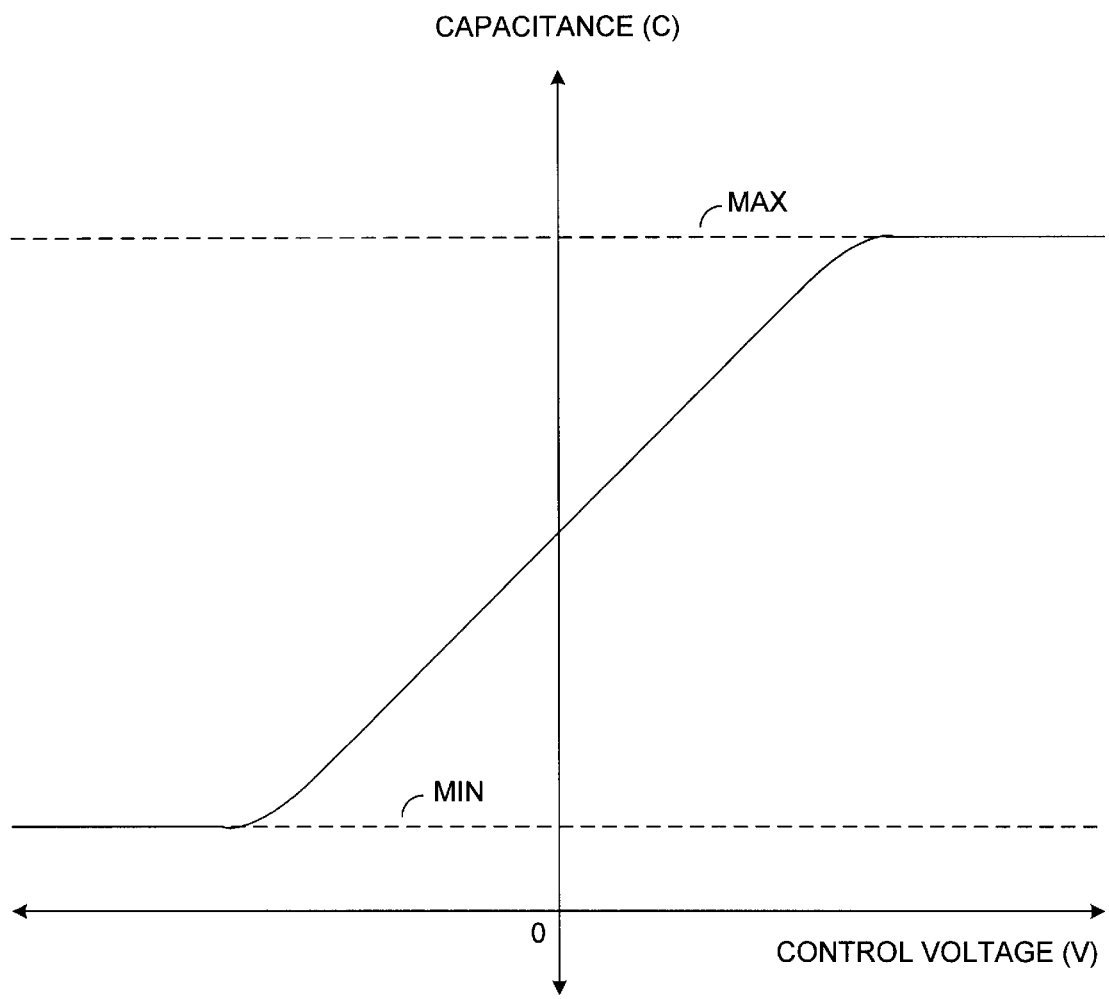
FIG. 3C illustrates a graph of a MOS-type variable capacitor varying according to its control voltage.

FIG. 3C illustrates the value of capacitance of a MOS-type variable capacitor varying according to its control voltage (V). The capacitance-voltage (C-V) curve demonstrates the linear relationship between a change in control voltage (V) and a change in capacitance (C) for the MOS-type variable capacitor. As shown in the figure, the capacitance value (C) reaches maximum and minimum value (MAX, MIN) when the control voltage (V) is substantially decreased or increased. As shown in the figure, the capacitance (C) has an approximately linear relationship with its control voltage (V) between the maximum and minimum capacitance values (MAX, MIN). A MOS-type variable capacitor can be used for variable capacitors (C201, C202) shown in FIG. 2, as well as other capacitor types.

Referring again to FIG. 3B, the effective total capacitance for each differentially controlled variable capacitor (C311, C312) remains the same despite the presence of a noise signal at the input. The frequency of oscillation is left insensitive to noise through this offset characteristic of the differentially controlled variable capacitors (C311, C312). The effect of noise at the input ports (CTRL1, CTRL2) can be described similarly for the oscillator of FIG. 3A.

Figure 4:
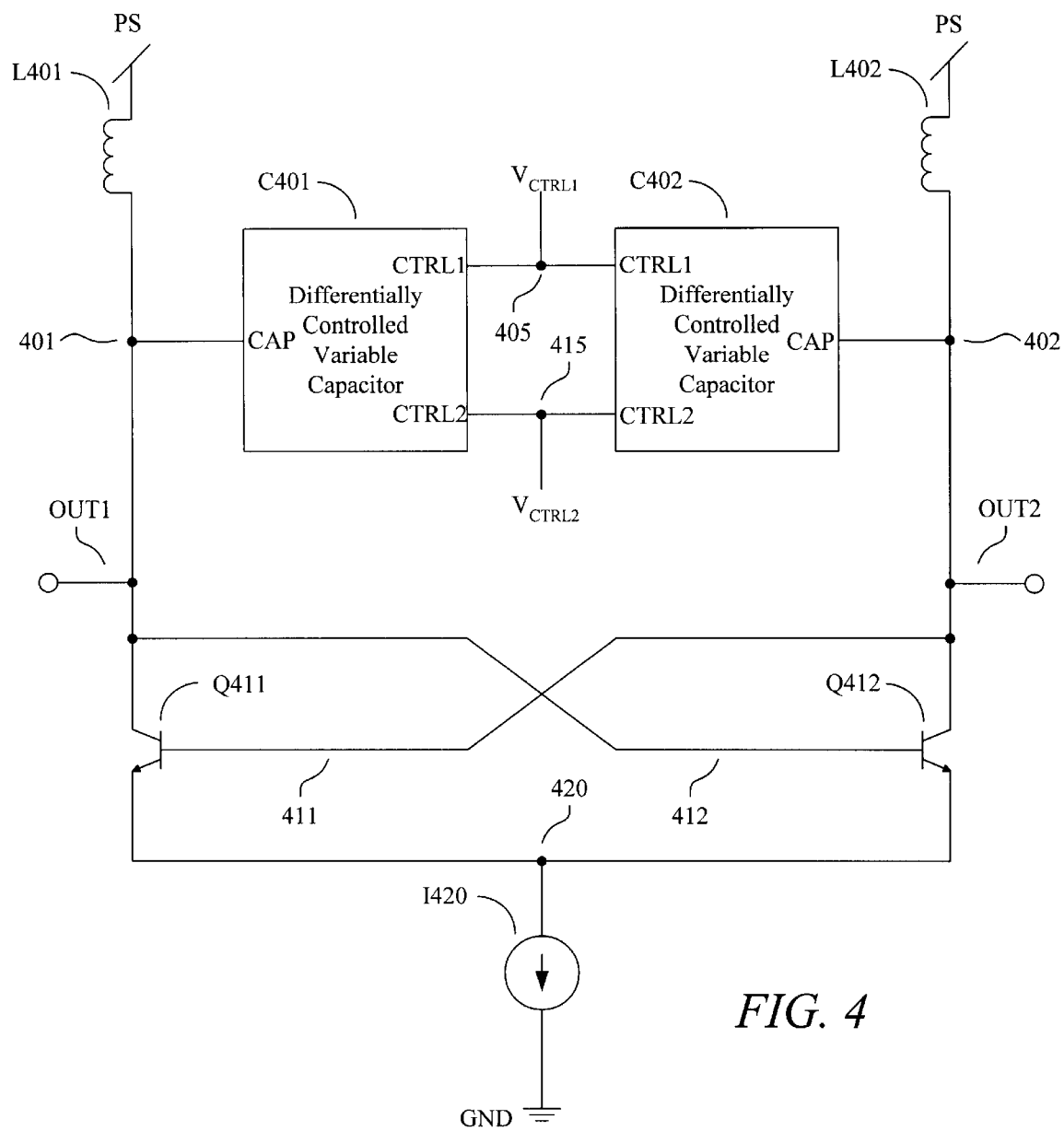
FIG. 4 shows a schematic diagram of an LC oscillator including differentially controlled variable capacitors.

FIG. 4 shows a schematic diagram of an exemplary LC oscillator including differentially controlled variable capacitors. The LC oscillator includes a power supply terminal (PS), input terminals ($V_{CTRL1}$, $V_{CTRL2}$), differentially controlled variable capacitors (C401, C402), inductors (L401, L402), transistors (Q411, Q412), a current source (I420), and output terminals (OUT1, OUT2). It is appreciated that the physical layout of the circuit may be critical to the operation of the circuit, as LC oscillators are typically designed to operate in the GHz range.

A differential input signal is supplied at the input terminals ($V_{CTRL1}$, $V_{CTRL2}$) to a pair of input nodes (405, 415).

The input terminals ($V_{CTRL1}$, $V_{CTRL2}$) are coupled to the differentially controlled variable capacitors (C401, C402) through two input nodes (405, 415). The output port (CAP) of one of the differentially controlled variable capacitors (C401) is coupled to one of two common nodes (401). The output port (CAP) of the other differentially controlled variable capacitor (C402) is coupled to the other common node (402). Each common node (401, 402) is connected to the supply terminal (PS) through a respective series connected inductor (L401, L402). The common nodes (401, 402) also supply the output terminals (OUT1, OUT2) for the LC oscillator.

The collector of one of the transistors (Q411) is coupled to one of the common nodes (401). The collector of the other transistor (Q412) is coupled to the other common node (402). The emitters of both transistors (Q411, Q412) are coupled to a current source (I420) through a source node (420). The current source (I420) is connected in series between the source node (420) and a ground plane (GND). The base of one of the transistors (Q411) is coupled to the opposite common node (402). The base of the other transistor (Q412) is coupled to the other common node (401).

The transistors of the LC oscillator operate to provide a positive feedback to generate the oscillating signal. The transistors (Q411, Q412) are biased at their bases by a bias circuit (not shown). The current source (I420) operates to set a current limit for the LC oscillator. It can be appreciated that any type of transistor technology can be used, including but not limited to, Bipolar, MOS, Gallium Arsenide, GASFET, and BiCMOS.

To illustrate an example of how the transistor portion of the LC oscillator in FIG. 4 operates, assume that the A.C. collector voltage of transistor Q411 is increasing due to the feedback at the base of transistor Q411. In response, the A.C. voltage at node 412 will also increase. The increase in the A.C. voltage at node 412 increases the A.C. base voltage of transistor Q412. The increase in the A.C. base voltage of transistor Q412 causes transistor Q412 to pull down it's A.C. collector voltage. As the A.C. collector voltage of transistor Q412 decreases, the A.C. voltage at node 411 decreases. The decrease in the A.C. voltage of node 411 causes transistor Q411 to experience a drop in it's A.C. base voltage. The drop in A.C. base voltage for transistor Q411 further drives it's A.C. collector voltage to increase. The feedback loop provides positive feedback to the oscillator, acting as a negative resistance to propagate the oscillating signal. A negative resistance is physically represented by the portion of circuit containing the transistors (Q411, Q412).

The inductors and capacitors of the LC oscillator determine the frequency, phase and amplitude of the oscillating signal propagated by the feedback portion of the LC oscillator. The common nodes (401, 402) are D.C. biased to specified values through the use of bias circuitry, as will be described with regards to FIG. 5. In this description, the difference between each input terminal ($V_{CTRL1}$, $V_{CTRL2}$) and a common node (401, 402) are equal. However, it can be appreciated that value at the input terminals ($V_{CTRL1}$, $V_{CTRL2}$) could vary from the common nodes (401, 402) by different values. If the values of the input terminals ($V_{CTRL1}$, $V_{CTRL2}$) vary from the value of the common nodes (401, 402), it may be required to tune the differentially controlled variable capacitors (C401, C402) to compensate. In addition, nominally, the values of the variable capacitors (C201, C202) shown in FIG. 2 within each differentially controlled variable capacitor (C401, C402) are equal. However, it can be appreciated that the values could be different if compensating for another property of the circuit.

Figure 5:
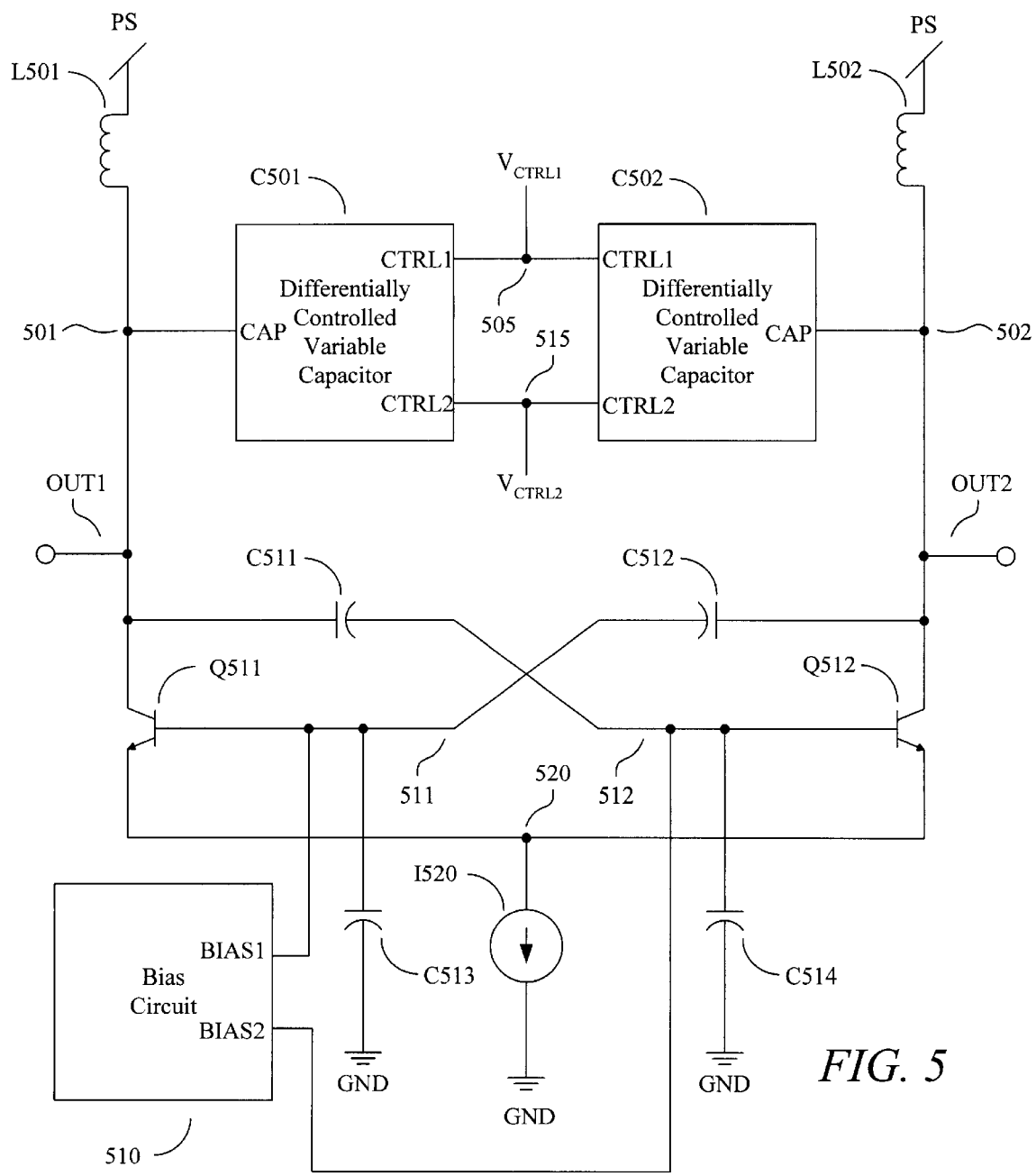
FIG. 5 illustrates a schematic diagram of an LC oscillator including differentially controlled variable capacitors and bias circuitry of the oscillator.

FIG. 5 illustrates a schematic diagram of an LC oscillator including differentially controlled variable capacitors and a bias circuit. The LC oscillator is similar to the oscillator shown in FIG. 4 with the addition of the bias circuit (510). The bias circuit includes two bias ports (BIAS1, BIAS2). The bias ports (BIAS1, BIAS2) are coupled to a respective base of a pair of transistors (Q511, Q512). Each transistor (Q511, Q512) is biased into active operation. AC coupling capacitors (C511, C512) are coupled in series between the base of each transistor (Q511, Q512) and opposite common nodes (501, 502). The A.C. coupling capacitors isolate the common nodes (501, 502) from the biasing potentials at the base of the transistors (Q511, Q512). Shunt capacitors (C513, C514) are coupled between the base of each transistor (Q511, Q512) and a ground potential. The shunt capacitors (C513, C514) and the A.C. coupling capacitors (C511, C512) divide the output swing reducing the signal size. The control signals ($V_{CTRL1}$, $V_{CTRL2}$) for the variable capacitors (C201, C202) are related to the potentials at the common nodes (501, 502).

Figure 6:
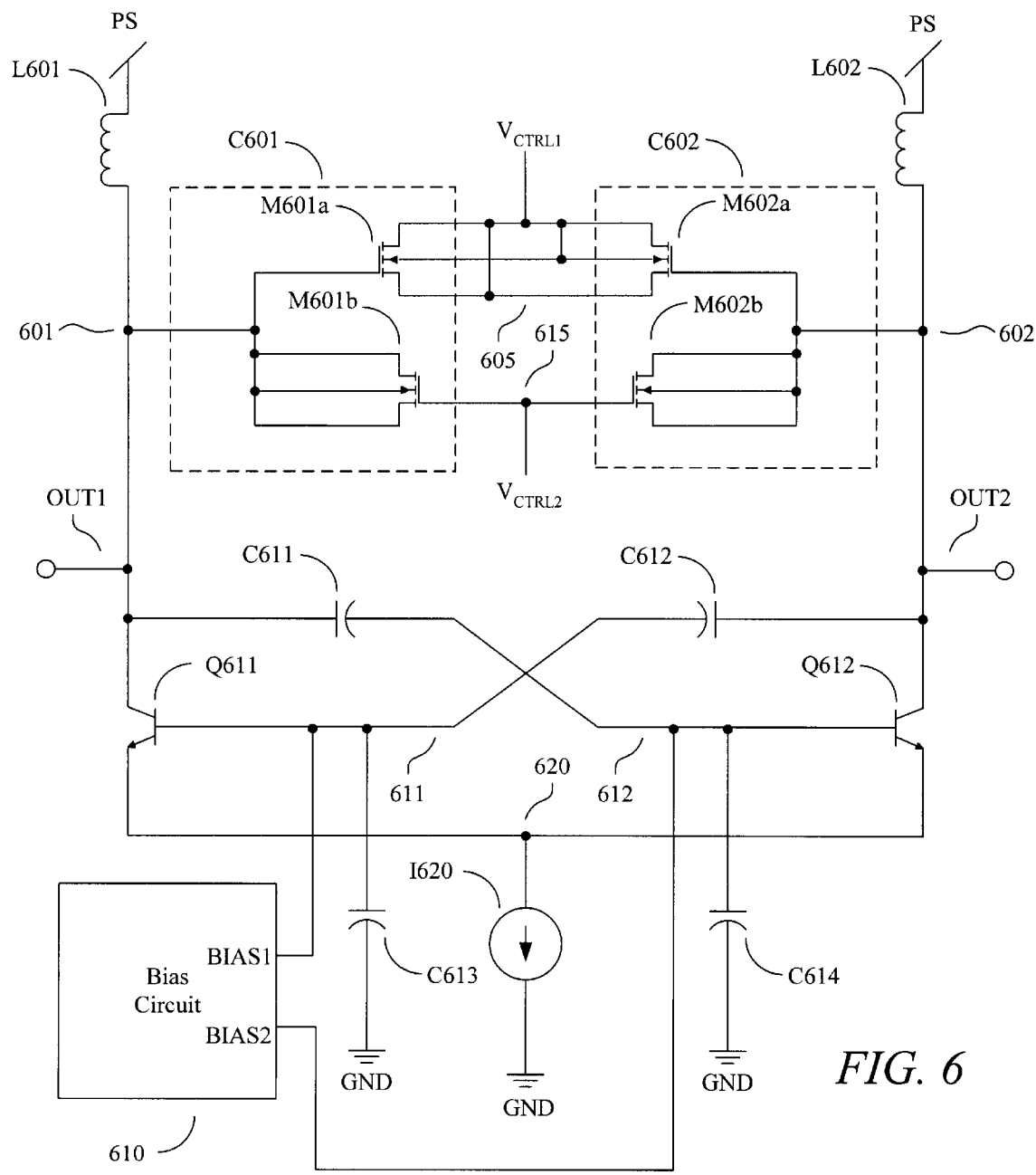
FIG. 6 shows a schematic diagram of an LC oscillator with differentially controlled variable capacitors, where MOS devices are used as the components of the variable capacitors.

FIG. 6 shows a schematic diagram of an LC oscillator that is similar to the oscillator of FIG. 5, where MOS devices are used as the components of the differentially controlled variable capacitors. MOS devices M601a and M601b, which comprise differentially controlled variable capacitor C601, replace the variable capacitors (C201, C202) from FIG. 2. Each MOS device (M601a, M601b, M602a, M602b) is arranged as a variable capacitor by shorting the drain, source, and having the gate act as the top plate of the variable capacitor.

The capacitance value of MOS device M601a changes with an injection of noise. The capacitance value of MOS device M601b changes in the opposite direction of the value for M601a, canceling the effect. The cancellation leaves the effective capacitance of differentially controlled variable capacitor C601 the same as before the common-mode noise was introduced. The operation of differentially controlled variable capacitor C602 imitates the operation of differentially controlled variable capacitor C601 in this respect. The use of the MOS devices (M601a, M601b, M602a, M602b) as variable capacitors provides an effective alternative embodiment in accordance with the present invention.

Analysis of how differentially controlled variable capacitor C601 cancels noise injected into the input terminals ($V_{CTRL1}$, $V_{CTRL2}$) at the common node (601) will follow below. Supposing the differences between the potential (Vcm) at common node 601, and the potentials ($V_{CTRL1}$, $V_{CTRL2}$) at input nodes 605 and 615 are equal (Vdiff), the following equations apply:

$$V_{CTRL1}=Vcm+Vdiff \quad (1)$$

$$V_{CTRL2}=Vcm-Vdiff \quad (2)$$

Therefore the potential across each MOS device is:

$$V(601, 605)=Vcm-V_{CTRL1}, \text{ for M601}a \quad (3)$$

$$V(615, 601)=V_{CTRL2}-Vcm, \text{ for M601}b \quad (4)$$

The potential of each MOS device is given by:

$$V(601, 605)=Vcm-(Vcm+Vdiff)=-Vdiff, \text{ for M601}a \quad (5)$$

$$V(615, 601)=(Vcm-Vdiff)-Vcm=-Vdiff, \text{ for M601}b \quad (6)$$

When the potentials for each MOS device (M601a, M601b) are combined according to their effective parallel combination, the effective total potential ($V_{C601}$) for differentially controlled variable capacitor C601 is obtained:

$$V_{C601}=V(601, 605)+V(615, 601) \quad (7)$$

$$V_{C601}=(-Vdiff)+(-Vdiff)=-2Vdiff \quad (8)$$

In this example, Both MOS devices (M601a, M601b) have a negative potential (-Vdiff), as can be seen in equations 5 and 6. The negative potential avoids forward-biasing the MOS devices (M601a, M601b). It is important that the MOS devices (M601a, M601b) remain reverse-biased to utilize their capacitance properties.

When a noise signal (Vn) is introduced at both input ports (CTRL1, CTRL2), the effective total capacitance for the MOS devices (M601a, M601b) is not affected by the noise signal (Vn). The noise signal (Vn) is cancelled due to the effective parallel connection of the MOS devices (M601a, M601b). The cancellation of the noise signal (Vn) is illustrated by the following set of equations:

$$V_{CTRL1}=Vcm+Vdiff+Vn \quad (9)$$

$$V_{CTRL2}=Vcm-Vdiff+Vn \quad (10)$$

Therefore the potential across each MOS remains:

$$V(601, 605)=Vcm-V_{CTRL1}, \text{ for M601}a \quad (11)$$

$$V(615, 601)=V_{CTRL2}-Vcm, \text{ for M601}b \quad (12)$$

Solving for the potential of each MOS device yields:

$$V(601, 605)=Vcm-(Vcm+Vdiff+Vn)=-Vdiff-Vn, \text{ for M601}a \quad (13)$$

$$V(615,601)=(Vcm-Vdiff+Vn)-Vcm=-Vdiff+Vn, \text{ for M601}b \quad (14)$$

When the potentials of each MOS device (M601a, M601b) are combined in parallel, the effective total potential ($V_{C601}$) for the differentially controlled variable capacitor (C601) represented by the MOS devices (M601a, M601b) is obtained:

$$V_{C601}=V(601, 605)+V(615, 601) \quad (15)$$

$$V_{C601}=(-Vdiff-Vn)+(-Vdiff+Vn)=-2Vdiff \quad (16)$$

Comparing the result of equation (16) with the result of equation (8), it can be seen that the effective total potential for differentially controlled variable capacitor C601 remains the same (-2Vdiff) despite the introduction of noise at the input nodes (605, 615). The equations are similar for differentially controlled variable capacitor C602.

Figure 7:
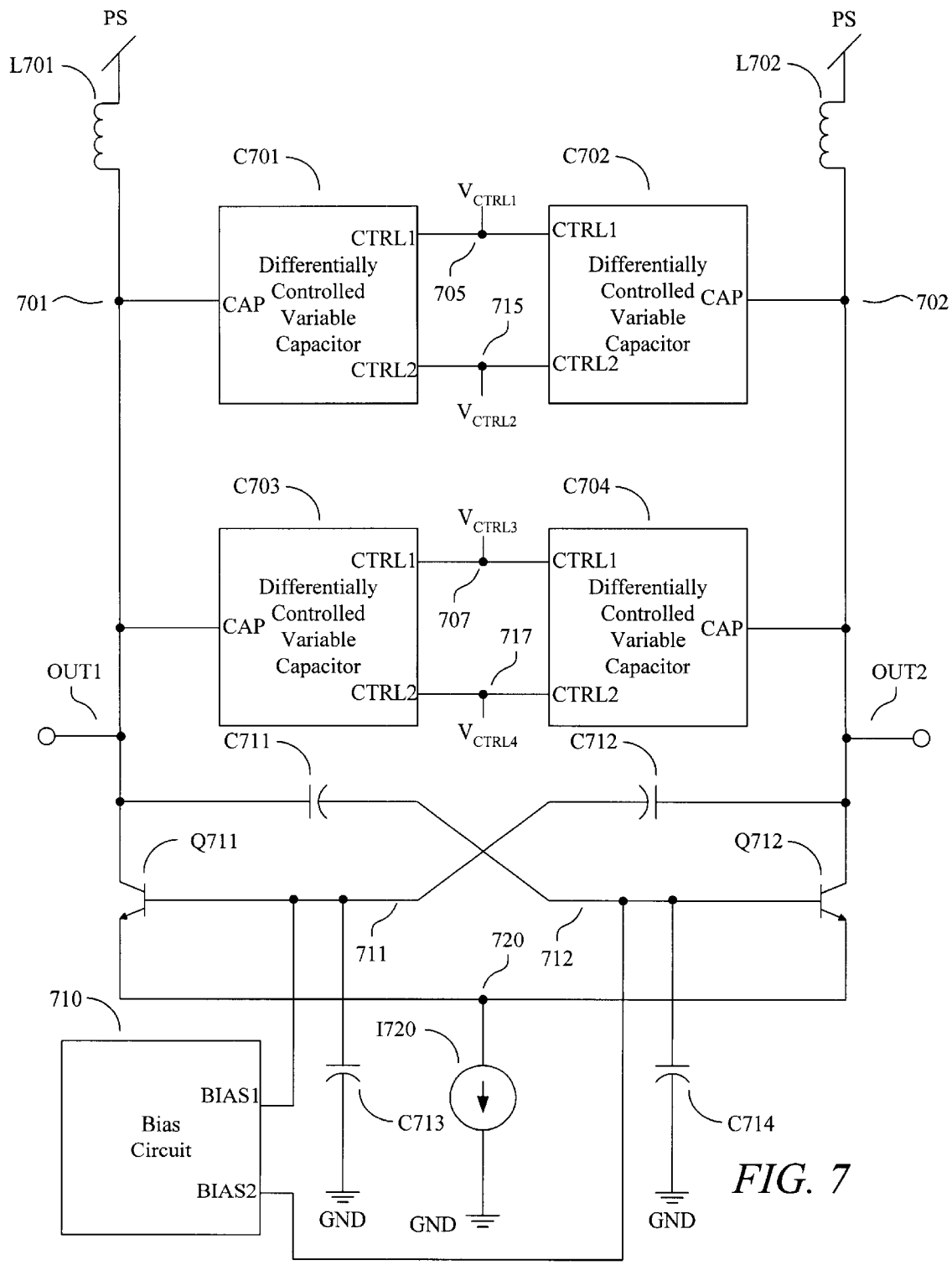
FIG. 7 illustrates a schematic diagram of an alternative embodiment of a LC oscillator with a differentially controlled variable capacitor according to one embodiment of the present invention.

FIG. 7 illustrates a schematic diagram of another alternative embodiment of a LC oscillator in accordance with the present invention. The LC oscillator is similar to the oscillator of FIG. 5 with an exception. The LC oscillator of FIG. 7, utilizes two sets of differentially controlled variable capacitors (C701, C702 and C703, C704) having two separate differential inputs ($V_{CTRL1}$, $V_{CTRL2}$, and $V_{CTRL3}$, $V_{CTRL4}$). The two sets of differentially controlled variable capacitors (C701, C702 and C703, C704) provide two levels for adjusting the frequency of the oscillating signal. In FIG. 7, differentially controlled variable capacitors C701 and C702 are configured to provide coarse adjustment of the frequency. Differentially controlled variable capacitors C703 and C704 are configured to provide a fine adjustment of the frequency of the present invention. It is understood and appreciated that additional tuning elements may be utilized in accordance with the present invention.

It can be appreciated that the present invention can be utilized in a variety of circuits, including, but not limited to emitters, phase-locked loops, and voltage-controlled oscillators. One aspect of the present invention related to these alternative embodiments provides for automatic adjustment of the oscillator frequency. Feedback from the oscillator circuit, or the circuit in which the oscillator is used can be used to adjust the frequency based on circuit performance. Input ports CTRL3 and CTRL4 can be used to provide a feedback path for the LC oscillator circuit. If a slight error exists in the oscillation frequency, differentially controlled variable capacitors C703 and C704 can correct the frequency according to the feedback provided. This adjustment would provide the LC oscillator with frequency correction for non-ideal factors not yet adjusted for, or unanticipated.

The above specification, examples and data provide a complete description of the manufacture and use of the composition of the invention. Since many embodiments of the invention can be made without departing from the spirit and scope of the invention, the invention resides in the claims hereinafter appended.

I claim:

1. An electronic circuit with at least one differentially controlled variable capacitance, comprising:
    a first differentially controlled variable capacitance has a first differential input and is connected to a first common node that is biased to a potential;
    a second differentially controlled variable capacitance has the first differential input and is connected to a second common node that is biased to a potential;
    a third differentially controlled variable capacitance has a second differential input and is connected to the first common node;
    a fourth differentially controlled variable capacitance has the second differential input and is connected to the second common node;
    a first differential control signal that is connected to the first differential input such that the first differential control signal changes a first capacitance value associated with the first differentially controlled variable capacitance and changes a second capacitance value associated with the second differentially controlled variable capacitance, wherein common mode noise at the first and second common nodes is minimized; and
    an oscillator circuit that oscillates at an oscillation frequency, wherein the first, seconds, third and fourth differentially controlled variable capacitances are arranged to tune the oscillation frequency, wherein the first and second differentially controlled variable capacitances provide fine adjustment of the oscillation frequency and the third and fourth differentially controlled variable capacitances provide coarse adjustment of the oscillation frequency.

2. An electronic circuit as in claim 1, further comprising one of an oscillator in a phase-locked loop, and an oscillator in a modulation circuit, wherein the oscillator oscillates at a frequency determined by the first and second capacitance values responsive to the first differential control signal.

3. An electronic circuit as in claim 1, further comprising a circuit that includes at least one active component that is arranged to provide positive feedback.

4. An electronic circuit as in claim 1, wherein the arrangement of the first and second differentially controlled variable capacitances minimizes adverse effects at the first and second common nodes from a noise signal contained in the first differential control signal.

5. A method for tuning an oscillation frequency in an oscillator, comprising:

connecting a first variable capacitor to a first common node in the oscillator, the first variable capacitor has a first associated value that is responsive to a first control signal;
connecting a second variable capacitor to the first common node in the oscillator, the second variable capacitor has a second associated value that is responsive to a second control signal;
connecting a third variable capacitor to a second common node in the oscillator, the third variable capacitor has a third associated value that is responsive to the first control signal;
connecting a fourth variable capacitor to the second common node in the oscillator, the fourth variable capacitor has a fourth associated value that is responsive to the second control signal;
connecting a fifth variable capacitor to the first common node in the oscillator, the fifth variable capacitor has a fifth associated value that is responsive to a third control signal;
connecting a sixth variable capacitor to the first common node in the oscillator, the sixth variable capacitor has a sixth associated value that is responsive to a fourth control signal;
connecting a seventh variable capacitor to the second common node in the oscillator, the seventh variable capacitor has a seventh associated value that is responsive to the third control signal;
connecting an eighth variable capacitor to the second common node in the oscillator, the eighth variable capacitor has an eighth associated value that is responsive to the fourth control signal; and
adjusting at least one of the first, second, third and fourth control signals such that at least one of the first, second, third, fourth, fifth, sixth, seventh, and eighth variable capacitors provide for tuning of the oscillation frequency that minimizes variations in the oscillation frequency due to common mode noise on the first, second, third and fourth control lines.

6. A method for ting an oscillator frequency as in claim 5, wherein the first and second control signals are one of a control voltage and a control current.

7. A method for tuning an oscillator frequency as in claim 5, wherein the first variable capacitor and the second variable capacitor are effectively parallel connected in operation, and the third variable capacitor and fourth variable capacitor are effectively parallel connected in operation.

8. A method for tuning an oscillator frequency as in claim 7, wherein the first variable capacitor and the second variable capacitor are arranged with opposite polarities, the third variable capacitor and the fourth variable capacitor are arranged with opposite polarities, and the first and second control signals have opposite polarities with respect to the first and second common nodes.

9. A method for tuning an oscillator frequency as in claim 5, wherein the first, second, third, and fourth variable capacitors provide for coarse tuning of the oscillation frequency, and the fifth, sixth, seventh, and eighth variable capacitors provide for fine tuning of the oscillation frequency.

10. An apparatus for minimizing noise effects in an oscillator with a variable oscillation frequency, comprising:
    a first variable capacitance means is connected to a common node in the oscillator;
    a second variable capacitance means is connected to the common node in the oscillator;

a third variable capacitance means is connected to a common node in the oscillator:

a fourth variable capacitance means is connected to the common node in the oscillator;

a first means for controlling the first variable capacitance means;

a second means for controlling the second variable capacitance means;

a third means for controlling the third variable capacitance means;

a fourth means for controlling the fourth variable capacitance means;

a means for varying the oscillation frequency with the first means for controlling and the second means for controlling such that the variable oscillation frequency is changed by the first and second variable capacitance means, whereby vacations in the variable oscillation frequency from noise effects are minimized by the arrangement of the first and second variable capacitance means; and a means for varying the variable oscillation frequency with the third means for controlling and the fourth means for controlling such that the variable oscillation frequency is changed by the third and fourth variable capacitance means, whereby variations in the variable oscillation frequency from noise effects are minimized by the arrangement of the third and fourth variable capacitance means, wherein the means for varying the variable oscillation frequency with first means for controlling and the second means for controlling is provided for fine adjustment of the oscillation frequency, and wherein the means for varying the variable oscillation frequency with third means for controlling and the fourth means for controlling is provided for coarse adjustment of the variable oscillation frequency.

11. An apparatus as in claim 10, wherein the first and second means for controlling comprise respective lines of a differential control means.

12. An apparatus as in claim 10, wherein the first and second variable capacitance means are arranged with opposite polarities to represent a differentially controlled variable capacitance means such that a capacitance value associated with the differentially controlled variable capacitance means at the common node is unchanged by noise effects.

13. An apparatus for minimizing noise effects in an oscillator with a variable oscillation frequency, comprising:

a first variable capacitance means is connected to a common node in the oscillator;

a second variable capacitance means is connected to the common node in the oscillator, a third variable capacitance means is connected to the common node in the oscillator;

a fourth variable capacitance means is connected to the common node in the oscillator;

a first means for controlling the first variable capacitance means;

a second means for controlling the second variable capacitance means;

a third means for controlling the third variable capacitance means;

a fourth means for controlling the fourth variable capacitance means;

a first means for varying the variable oscillation frequency with the first means for controlling and the second means for controlling such that the variable oscillation frequency is changed by the first and second variable capacitance means, whereby variations in the variable oscillation frequency from noise effects are minimized by the arrangement of the first and second variable capacitance means; and a second means for varying the oscillation frequency with the third means for controlling and the fourth means for controlling such that the variable oscillation frequency is changed by the third and fourth variable capacitance means, whereby variations in the variable oscillation frequency from noise effects are minimized by the arrangement of the third and fourth variable capacitance means, wherein the first means for varying the variable oscillation frequency with first means for controlling and the second means for controlling is provided for fine adjustment of the oscillation frequency, and wherein the second means for varying the variable oscillation frequency with third means for controlling and the fourth means for controlling is provided for coarse adjustment of the variable oscillation frequency.

* * * * *

UNITED STATES PATENT AND TRADEMARK OFFICE
CERTIFICATE OF CORRECTION

PATENT NO. : 6,657,509 B1
DATED : December 2, 20003
INVENTOR(S) : James R. Ohannes It is certified that error appears in the above-identified patent and that said Letters Patent is hereby corrected as shown below:

<u>Column 10,</u>
Line 40, please replace "ting" with -- tuning --.

Signed and Sealed this

Sixth Day of July, 2004

JON W. DUDAS
*Acting Director of the United States Patent and Trademark Office*